(12) United States Patent
Jennings et al.

(10) Patent No.: US 8,288,239 B2
(45) Date of Patent: Oct. 16, 2012

(54) THERMAL FLUX ANNEALING INFLUENCE OF BURIED SPECIES

(75) Inventors: Dean C. Jennings, Beverly, MA (US); Amir Al-Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

(21) Appl. No.: 10/261,379

(22) Filed: Sep. 30, 2002

(65) Prior Publication Data

US 2004/0063290 A1    Apr. 1, 2004

(51) Int. Cl.
    *H01L 21/336* (2006.01)
(52) U.S. Cl. ........ 438/308; 438/149; 438/479; 438/517; 257/E27.112; 257/E21.32
(58) Field of Classification Search .................. 438/487, 438/436, 439, 149, 219, 295, 404; 219/121.73, 219/121.65, 121.8; 257/479, 347, 524
See application file for complete search history.

(56) References Cited

U.S. PATENT DOCUMENTS

| | | | | |
|---|---|---|---|---|
| 4,309,225 A * | 1/1982 | Fan et al. | ........................ | 438/72 |
| 5,266,502 A * | 11/1993 | Okada et al. | .................. | 438/766 |
| 5,629,217 A | 5/1997 | Miwa et al. | | |
| 6,054,739 A * | 4/2000 | Yamazaki et al. | ............. | 257/347 |
| 6,110,845 A * | 8/2000 | Seguchi et al. | ................ | 438/795 |
| 6,242,292 B1 | 6/2001 | Yamazaki et al. | | |
| 6,393,042 B1 | 5/2002 | Tanaka | | |
| 6,796,148 B1 * | 9/2004 | Borrelli et al. | .................. | 65/386 |
| 2001/0020722 A1 * | 9/2001 | Yang | .............................. | 257/347 |
| 2002/0098712 A1 * | 7/2002 | Mavoori et al. | | |
| 2003/0003610 A1 * | 1/2003 | Yamazaki et al. | ............... | 438/14 |
| 2003/0042430 A1 * | 3/2003 | Tanaka et al. | ............... | 250/492.1 |
| 2003/0071312 A1 * | 4/2003 | Oana et al. | ..................... | 257/368 |
| 2003/0196993 A1 | 10/2003 | Jennings | | |
| 2003/0196995 A1 | 10/2003 | Jennings | | |
| 2003/0196996 A1 | 10/2003 | Jennings et al. | | |
| 2008/0254598 A1 * | 10/2008 | Yamazaki et al. | ............ | 438/473 |

FOREIGN PATENT DOCUMENTS

| | | |
|---|---|---|
| CN | 1131341 | 9/1996 |
| KR | 132495 | * 4/1994 |
| WO | WO-01/73769 | 10/2001 |

OTHER PUBLICATIONS

Webster John G., "Wiley Encyclopedia of Electrical and Electronics Engineering", vol. 6, pp. 565-566, 1999.*

(Continued)

*Primary Examiner* — Thanh Nguyen
(74) *Attorney, Agent, or Firm* — Blakely, Sokoloff, Taylor & Zafman LLP

(57) ABSTRACT

A method including introducing a species into a substrate including semiconductor material; and translating linearly focused electromagnetic radiation across a surface of the substrate, the electromagnetic radiation being sufficient to thermally influence the species. An apparatus including an electromagnetic radiation source; a stage having dimensions suitable for accommodating a semiconductor substrate within a chamber; an optical element disposed between the electromagnetic radiation source and the stage to focus radiation from the electromagnetic radiation source into a line having a length determined by the diameter of a substrate to be placed on the stage; and a controller coupled to the electromagnetic radiation source including machine readable program instructions that allow the controller to control the depth into which a substrate is exposed to the radiation.

23 Claims, 6 Drawing Sheets

OTHER PUBLICATIONS

Wolf et al., "Silicon Processing for the VLSI Era", vol. 1, p. 199.*
Houghton Miffin Company, "The American Heritage Stedman's Medical Dictionary", 1995, 2001, 2002.*
Satoru, K., et al., "Effects of Oxygen Concentration and Annealing Sequence on Microstructure of Separation by Implanted Oxygen Wafer with High-Temperature Annealing," Japanese Journal of Applied Physics, vol. 30, No. 1, 1991, pp. 112-115, Publication Office Japanese Journal of Applied Physics, Tokyo, Japan.
Office Action dated Dec. 1, 2006 (with English translation), Chinese Application No. 03823083.6, Applied Materials, Inc.

* cited by examiner

THERMAL FLUX ANNEALING INFLUENCE OF BURIED SPECIES

BACKGROUND

1. Field

Thermal processing by scanning a substrate with a line of radiation.

2. Description of Related Art

The integrated circuit (IC) market is continually demanding greater memory capacity, faster switching speeds, and smaller feature sizes. One of the major steps the industry has taken to address these demands is to change from batch processing a substrate, such as a wafer (e.g., silicon wafer), in large furnaces to single substrate processing in a small chamber.

During single substrate processing, a substrate is typically heated to high temperatures so that various chemical and physical reactions can take place in multiple IC devices defined in the wafer. Of particular interest, favorable electrical performance of the IC devices requires implanted regions to be annealed. In general, annealing recreates a more crystalline structure from regions of a semiconductor substrate that were previously made amorphous, and activates dopants by incorporating their atoms into the crystalline lattice of the substrate. Thermal processes, such as annealing, require providing a relatively large amount of thermal energy to the substrate in a short amount of time, and thereafter rapidly cooling the substrate to terminate the thermal process. Examples of thermal processes currently in use include Rapid Thermal Processing (RTP) and impulse (spike) annealing. While such processes are widely used, current technology is not ideal. It tends to ramp the temperature of the substrate too slowly and expose the substrate to elevated temperatures for too long. These problems become more severe with increasing substrate sizes, increasing switching speeds, and/or decreasing feature sizes.

In general, these thermal processes heat a substrate under controlled conditions according to a predetermined thermal recipe. These thermal recipes fundamentally consist of: a temperature that the semiconductor substrate must be heated to; the rate of change of temperature, i.e., the temperature ramp-up and ramp-down rates; and the time that the thermal processing system remains at a particular temperature. For example, thermal recipes may require the substrate to be heated from room temperature to temperatures of 1200° C. or more, for processing times at each distinct temperature ranging up to 60 seconds or more.

Moreover, to meet certain objectives, such as minimal diffusion, the amount of time that a semiconductor substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible.

The requirement for high temperature ramp rates led to the development of Rapid Thermal Processing (RTP), where typical temperature ramp-up rates range from 200 to 400° C./second (° C./s), as compared to 5 to 15° C./minute for conventional furnaces. Typical ramp-down rates are in the range of 80 to 150° C./s. A drawback of RTP is that it heats the entire substrate even though the circuit devices typically reside only in the top few microns of a semiconductor substrate (e.g., a silicon wafer). This limits how fast a substrate can be heated up and cooled down. Moreover, once the entire substrate is at an elevated temperature, heat can only dissipate into the surrounding space or structures. As a result, state of the art RTP systems struggle to achieve a 400° C./s ramp-up rate and a 150° C./s ramp-down rate.

One technique that appears promising for increasing IC device switching speeds perhaps while maintaining similar feature sizes is semiconductor on Insulator (SOI) technology. One SOI technology involves implanting an oxygen species into a semiconductor substrate and annealing the substrate to form an insulating layer at a depth of a few hundred to a few thousand Angstroms (Å) into the substrate, creating a monocrystalline semiconductor region above the insulator layer and a bulk semiconductor substrate below the insulating layer. The monocrystalline layer above the insulator layer may be used to form devices therein and thereon. In general, such devices may be made without all of the necessary implants (e.g., without well implants) that generally accompany conventional circuit device processing. Accordingly, switching speeds of the devices tend to be greater and limitations, such as leakage current, tend to be reduced.

The SOI process described above generally requires a RTP step to form the insulator layer. Representatively, as noted above, an oxygen species is implanted and a thermal annealing is performed to form the insulator layer through a process known as Otswald Ripening. One problem with such an SOI formation process is that the anneal time, using conventional RTP processing, tends to be too long to be commercially feasible.

SUMMARY

A method is described. The method, in one embodiment, includes introducing a species, such as an oxygen species, into a substrate including semiconductor material and translating linearly focused electromagnetic radiation across a surface of the substrate. The electromagnetic radiation may be sufficient to thermally influence the species, for example to thermally influence an oxygen species to form an oxide (e.g., $SiO_2$) layer within the substrate. By using focused electromagnetic radiation, such as radiation available from a laser source, an insulator layer in semiconductor material may be formed much more rapidly than conventional RTP processing. The electromagnetic radiation is capable of heating a small portion of the surface of the substrate at any given moment, thereby achieving very short anneal times. By using radiation that is capable of raising the temperature of the substrate close to but not above the melting point of the substrate material, the formation of, for example, an insulator layer may be formed rapidly and uniformly.

Also described is an apparatus that includes an electromagnetic radiation source and a stage having dimensions suitable for accommodating a semiconductor substrate within a chamber. An optical element is disposed between the electromagnetic source and the stage to focus radiation from the electromagnetic radiation source into a line having a length determined by the diameter of a substrate to be placed on the stage. A controller may be coupled to the electromagnetic radiation source. The controller includes machine readable program instructions that allow the controller to control the depth into which the substrate is exposed to radiation. Accordingly, in a process such as an SOI process, where an oxygen species is implanted into the semiconductor substrate, the controller of the apparatus can control the electromagnetic radiation source to heat, in a generally linear fashion, the substrate only to a depth necessary for the formation of the insulator layer. Since the whole substrate is not heated as in a conventional RTP process, the annealing to form an insulator layer may be performed more rapidly than in a conventional RTP process.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

Figure 1:
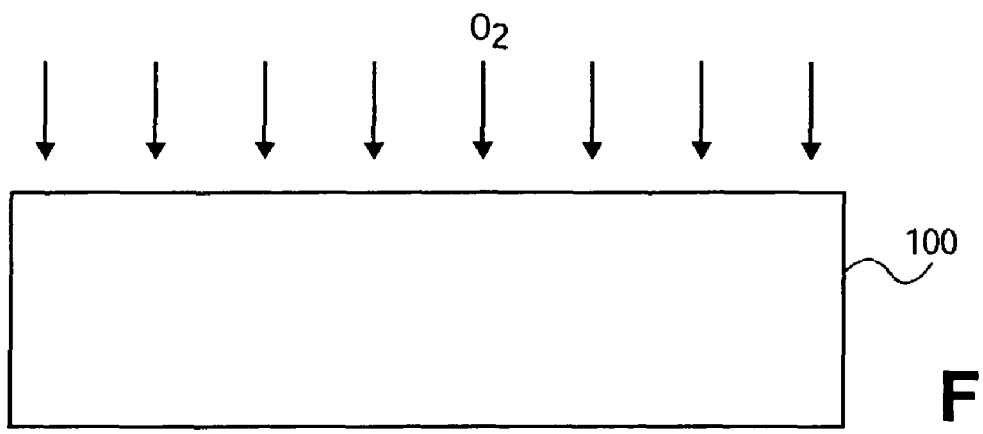
FIG. 1 is a schematic, cross-sectional side view of a portion of a semiconductor substrate being exposed to oxygen implantation.
Figure 2:
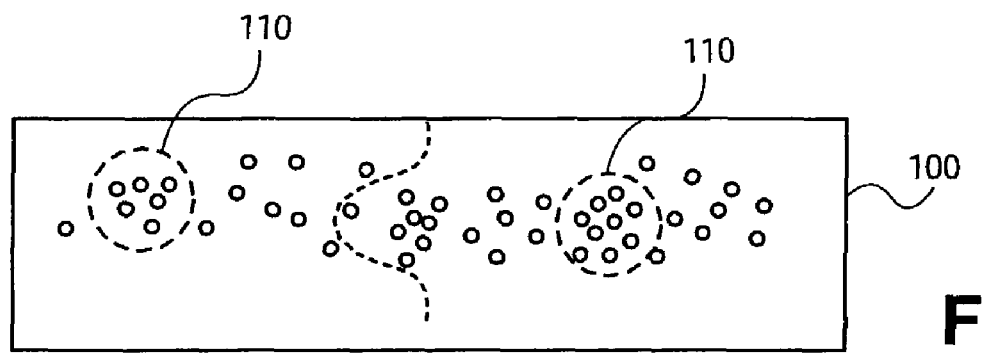
FIG. 2 shows the substrate of FIG. 1 following the introduction of oxygen species into the substrate.
Figure 3:
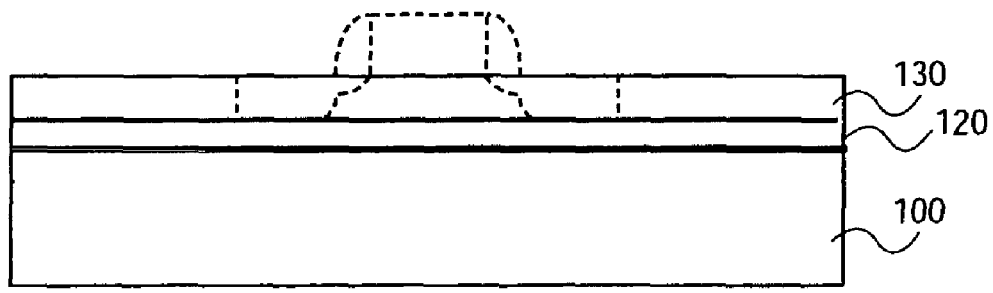
FIG. 3 shows the substrate of FIG. 2 following the formation of an insulator (e.g., oxide) layer.

FIGS. 1-3 illustrate a process of forming a semiconductor on insulator (SOI) structure that may be used, for example, for fabricating integrated circuits (IC) dies or chips therefrom. FIG. 1 shows a portion of a semiconductor substrate such as a silicon wafer, with a representative diameter on the order of 200 millimeters (mm) or 300 mm and a representative thickness of 1,000 microns or less (e.g., 750 microns). FIG. 1 shows an oxygen species, such as oxygen ($O_2$) being introduced (implanted) into substrate 100, such as in the form of oxygen ions ($O^+$). According to one SOI process, an oxygen implantation into a semiconductor substrate follows a generally Gaussian distribution of oxygen atoms within the substrate. Representatively, the oxygen species tend to initially form $SiO_x$, where x is 0 to 2. Referring to FIG. 2, these $SiO_x$ molecules tend to cluster (illustrated by reference numeral 110) and, when subject to a thermal anneal of preferably a temperature of 1200° C. or greater, form an insulator layer of $SiO_2$ through a process known as Otswald ripening.

FIG. 3 illustrates the structure of FIG. 2 following an annealing. FIG. 3 shows substrate 100 including insulator layer 120 formed at a depth on the order of 200 angstroms (Å) to 3000 Å into substrate 100 (representatively, on the order of a depth of 100 Å to 1500 Å into the substrate), depending generally on whether a partially-depleted (PD) or fully-depleted (FD) device is to be fabricated on the single crystalline layer above insulator layer 120. Overlying insulator layer 120 is monocrystalline layer 130 of semiconductor (e.g., silicon) material. Below insulator layer 120 is the bulk of substrate 100. Once formed, active and passive devices, such as transistors, resistors, capacitors, etc. may be formed in monocrystalline layer 130. For FD SOI, monocrystalline layer 130 of silicon typically varies from 100 Å to 400 Å (e.g., 200 Å) and insulator layer 120 of $SiO_2$ varies from 200 Å to 800 Å (e.g., 400 Å). For PD SOI, monocrystalline layer 130 of silicon varies from 500 Å to 1500 Å (e.g., 1000 Å) and insulator layer 120 of $SiO_2$ varies from 1000 Å to 3000 Å (e.g., 2000 Å).

Figure 4:
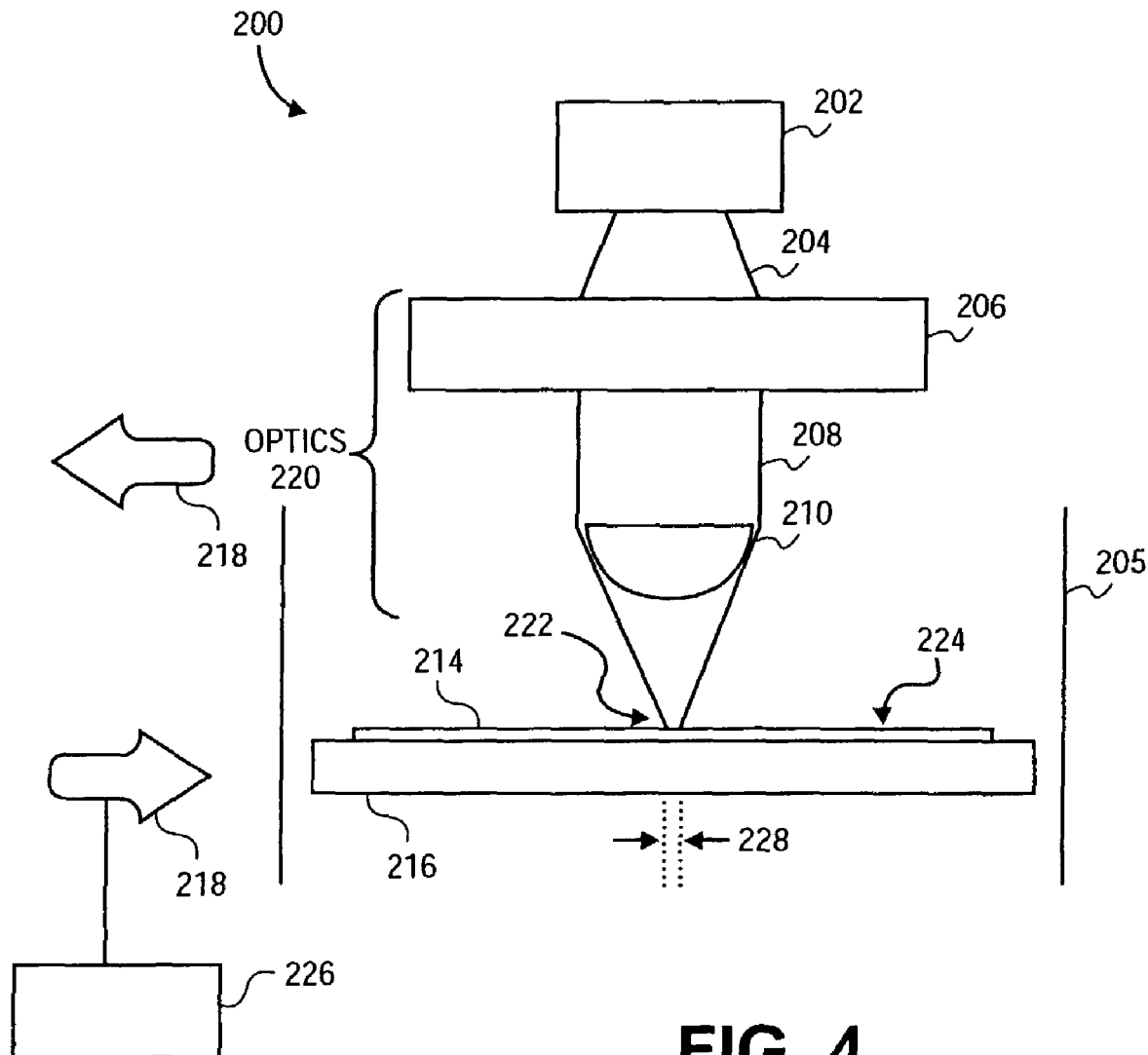
FIG. 4 is a schematic, cross-sectional side view of an apparatus for thermally processing a semiconductor substrate.

FIG. 4 is a side view of an apparatus for thermally processing a semiconductor substrate, such as to form the SOI structure shown in FIG. 3 (e.g., to thermally anneal structure 100 of FIG. 2). A similar apparatus is described in commonly-owned assigned U.S. patent application Ser. No. 10/126,419, filed Apr. 18, 2002, titled "Thermal Flux Processing by Scanning," and U.S. patent application Ser. No. 10/202,119, filed Jul. 23, 2002, titled "Thermal Flux Deposition by Scanning," each of which are incorporated herein by reference. As noted above, one thermal process is annealing and annealing will be described throughout the remainder of the figures. Referring to FIG. 4, apparatus 200 includes continuous wave electromagnetic radiation source 202, stage 216 configured to receive semiconductor substrate 214 thereon, and optics 220 disposed between electromagnetic radiation source 202 and stage 216. Apparatus 200 may further include chamber 205 that is sized to house stage 216 and substrate 214 and, optionally, optics 220 and electromagnetic radiation source 202.

Electromagnetic radiation source 202 is capable of emitting continuous waves or rays of electromagnetic radiation, such as light (e.g., laser light). By continuous wave it is meant that the radiation source is capable of emitting radiation continuously, i.e., not a burst, pulse, or flash of light. Unlike lasers used, for example, in prior art laser annealing, a suitable continuous wave electromagnetic radiation source is capable of emitting radiation continuously for durations contemplated for thermal processing. In one embodiment, electromagnetic radiation source 202 is capable of emitting radiation continuously for at least 15 seconds.

Furthermore, in one embodiment, the continuous wave electromagnetic radiation is to be absorbed at or near the surface of the substrate. For a silicon substrate (e.g., substrate 100 in FIGS. 1-3), the continuous wave electromagnetic radiation preferably has a wavelength between 190 nanometers (nm) and 950 nm (e.g., 808 nm).

In one embodiment, electromagnetic radiation source 202 comprises multiple laser diodes, each of which produces uniform and spatially coherent light at the same wavelength. In yet another embodiment, the power of the laser diode/s is in the range of 0.5 kilowatts (kW) to 50 kW (e.g., approximately kW). Suitable laser diodes are made by Spectra-Physics of California, or by Cutting Edge Optronics, Inc. of St. Charles, Mo. One such suitable laser diode is Spectra Physics' MONSOON® multi-bar module (MBM), which provides 40 to 480 watts of continuous wave power per laser diode. In one embodiment, electromagnetic radiation source 202 is connected electronically to controller 226. Controller 226 may include machine readable program instructions (instruction logic) for controlling the intensity of electromagnetic radiation source 202.

In the embodiment illustrated in FIG. 4, optics 220 includes one or more collimators 206 to collimate radiation 204 from the continuous wave electromagnetic radiation source 202 in a direction (as viewed) perpendicular to surface 224 of substrate 214. Collimated radiation 208 is then focused by at least one lens 210 into line of radiation 222 at upper surface 224 of semiconductor substrate 214. Optics 220 may be electronically connected to controller 226. Controller 226 may include machine readable program instructions (instruction logic) for focusing collimated radiation 228 into a desired line length (e.g., across the entire diameter substrate 214) and line width (e.g., 3 μm to 500 μm).

Lens 210 is a lens, or series of lenses, capable of focusing radiation into a line. In one embodiment, lens 210 is a cylindrical lens. Alternatively, lens 210 may be one or more concave lenses, convex lenses, plane mirrors, concave mirrors, convex mirrors, refractive lenses, diffractive lenses, Fresnel lenses, gradient index lenses, or the like.

Stage 216 is a platform capable of securely holding substrate 214 during translation, as explained below. In one embodiment, stage 216 includes a mechanism for grasping the substrate, such as a frictional, gravitational, mechanical, or electrical system. Examples of suitable mechanism for grasping include, mechanical clamps, electrostatic or vacuum chucks, or the like.

Apparatus 200 also includes translation mechanism 218 configured to translate stage 216 and line of radiation 222 relative to one another. In one embodiment, translation mechanism 218 is connected to stage 216 to move stage 216 relative to electromagnetic radiation source 202 and/or optics 220. In another embodiment, translation mechanism 218 is connected to electromagnetic radiation source 202 and/or optics 220 to move electromagnetic radiation source 202 and/or optics 220 relative to stage 216. In yet another embodiment, translation mechanism 218 moves both electromagnetic radiation source 202 and/or optics 220, and stage 216. Any suitable translation mechanism may be used, such as a conveyor system, rack and pinion system, or the like.

Translation mechanism 218 is also connected electronically, in one embodiment, to controller 226 to control the scan speed at which stage 216 and line of radiation 222 move relative to one another. In addition, the translation of stage 216 and line of radiation 222 relative to one another is representatively along a path perpendicular to the line of radiation 222 and parallel to upper surface 224 of substrate 214 (as viewed). In one embodiment, translation mechanism 218 moves at a constant speed. Representatively, this constant speed is approximately 2 centimeters per second (cm/s) for a 35 micron wide line. In another embodiment, the translation of stage 216 and line of radiation 222 relative to one another does not have to be a path perpendicular to one another as long as the angled radiation is linearly focused on stage 216. Controller 226 may include machine readable program instructions (instruction logic) for translating stage 216 and/or electromagnetic radiation source 202 relative to one another so that line of radiation 222 moves along a path across the entire surface of substrate 214. In another embodiment, the machine readable program instructions include instruction logic to adjust a recipe for scan speed or radiation intensity to get to an appropriate depth for requisite reaction. In terms of an SOI process where one objective of thermal processing using electromagnetic radiation is to form an insulator layer beneath a substrate surface, the instruction logic may also adjust a scan speed of translation mechanism 218 or the intensity of electromagnetic radiation source 202 according to a recipe for a particular process (e.g., FDSOI or PDSOI).

Figure 5:
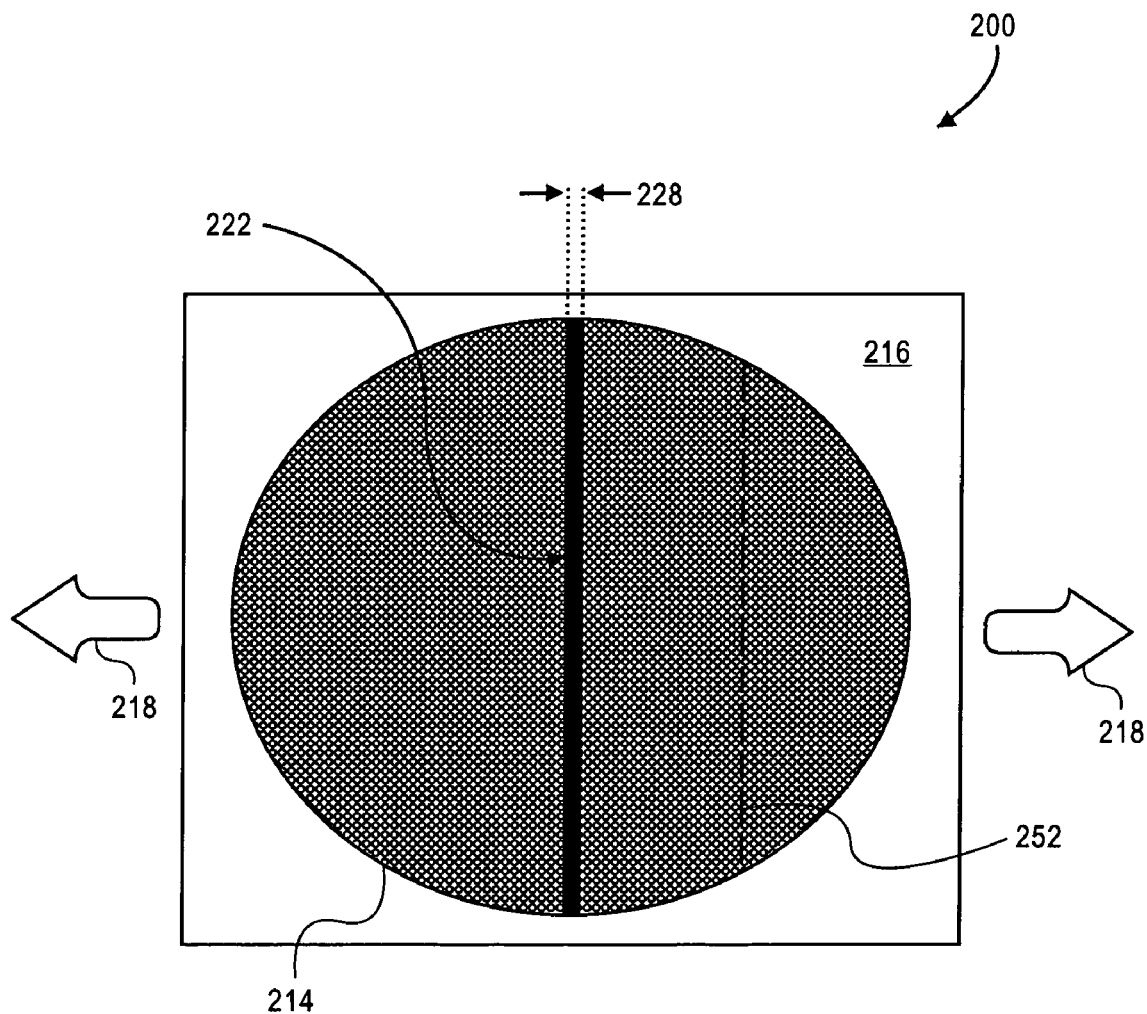
FIG. 5 is a top view of the substrate and stage shown in FIG. 5.

FIG. 5 is a top view of the substrate and stage shown in FIG. 4. In one embodiment, substrate 214 is a circular wafer with a diameter of 200 mm or 300 mm, and a thickness of approximately 750 microns. Also, in one embodiment, line of radiation 222 has a length that extends at least across the entire diameter or width of substrate 214. Line of radiation 222 has width 228 on the order of between 3 and 500 microns. In one embodiment, line of radiation 222 has a width 228 of approximately 35 microns. The width is measured at half the maximum intensity of the radiation (otherwise knows as Full Width Half Max (FWHM)). In the embodiment illustrated, the length of the line is longer than its width. In one embodiment, line of radiation 222 linearly traverses semiconductor substrate 214, such that it remains parallel to fixed line or chord 252 at all times. In another embodiment, the line of continuous wave electromagnetic radiation does not extend across the entire width of the semiconductor substrate. Rather, the line extends across the partial width of the semiconductor substrate. In this embodiment, the line of continuous wave electromagnetic radiation may make more than one scan across the substrate surface.

One power density at line of radiation 222 is between 10 $kW/cm^2$ and 200 $kW/cm^2$ with a nominal range near 60 $kW/cm^2$. It is generally not readily achievable to radiate the entire surface of a substrate at these power densities, but it is possible to scan across the substrate a line of radiation that has this intensity. For example, an experiment using a 400 microns wide line of radiation with a peak power density of 70 $kW/cm^2$ scanned at 100 cm/s, heated the surface of a silicon substrate to approximately 1170° C. with ramp-up and ramp-down rates exceeding 4 million ° C./s.

Figure 6:
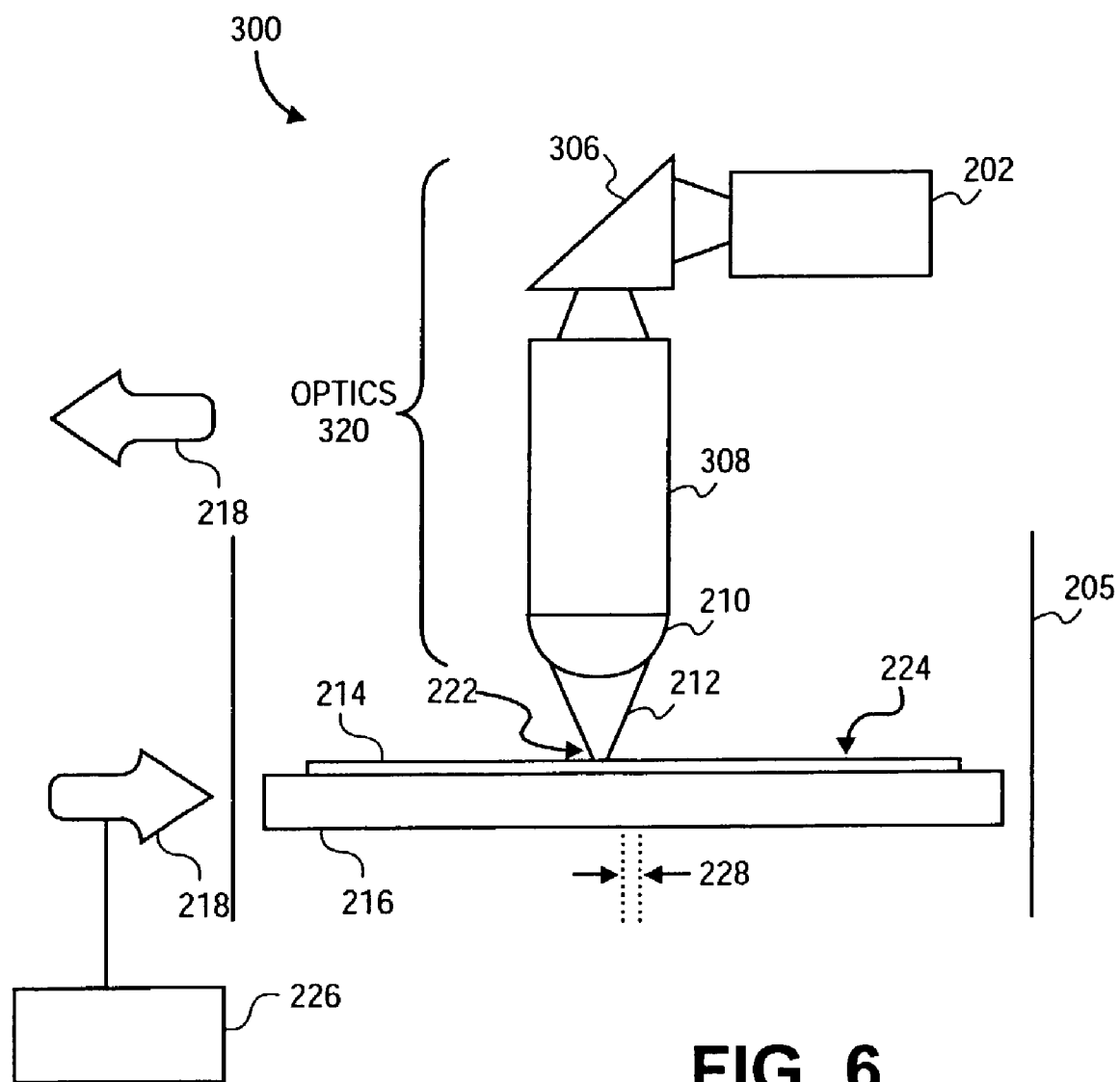
FIG. 6 is a schematic, cross-sectional side view of another apparatus for thermally processing a semiconductor substrate, according to another embodiment of the invention.

FIG. 6 is a side view of another apparatus for thermally processing a substrate. The embodiment shows another arrangement of the optics portion of an apparatus. In this embodiment, apparatus 300 includes optics 320 of lens 210 and one or more radiation guides, such as one or more optical fibers 308 and prism 306. Other radiation guides such as a waveguide, mirror, or diffuser may also or alternatively be used. In this embodiment, stage 216, substrate 224, and optionally some portion of optics 320 (including the entire portion) and electromagnetic radiation source 202 may be contained within chamber 205.

Referring to FIG. 6, radiation from electromagnetic radiation source 202 is directed at prism 306 which redirects the radiation towards one or more optical fibers 308. Radiation is transmitted through optical fiber(s) 308 towards lens 210, where it is focused into line of radiation 222.

It should be appreciated that many different combinations of the aforementioned optics 220 (FIG. 4) or 320 (FIG. 6) may be used to transmit and focus the radiation from the continuous wave electromagnetic radiation source into a line of radiation. Also, a linear array of laser diodes could be used as the radiation source. Additionally, any suitable means for producing a uniform radiation distribution, such as a radiation diffuser, may be used.

Figure 7:
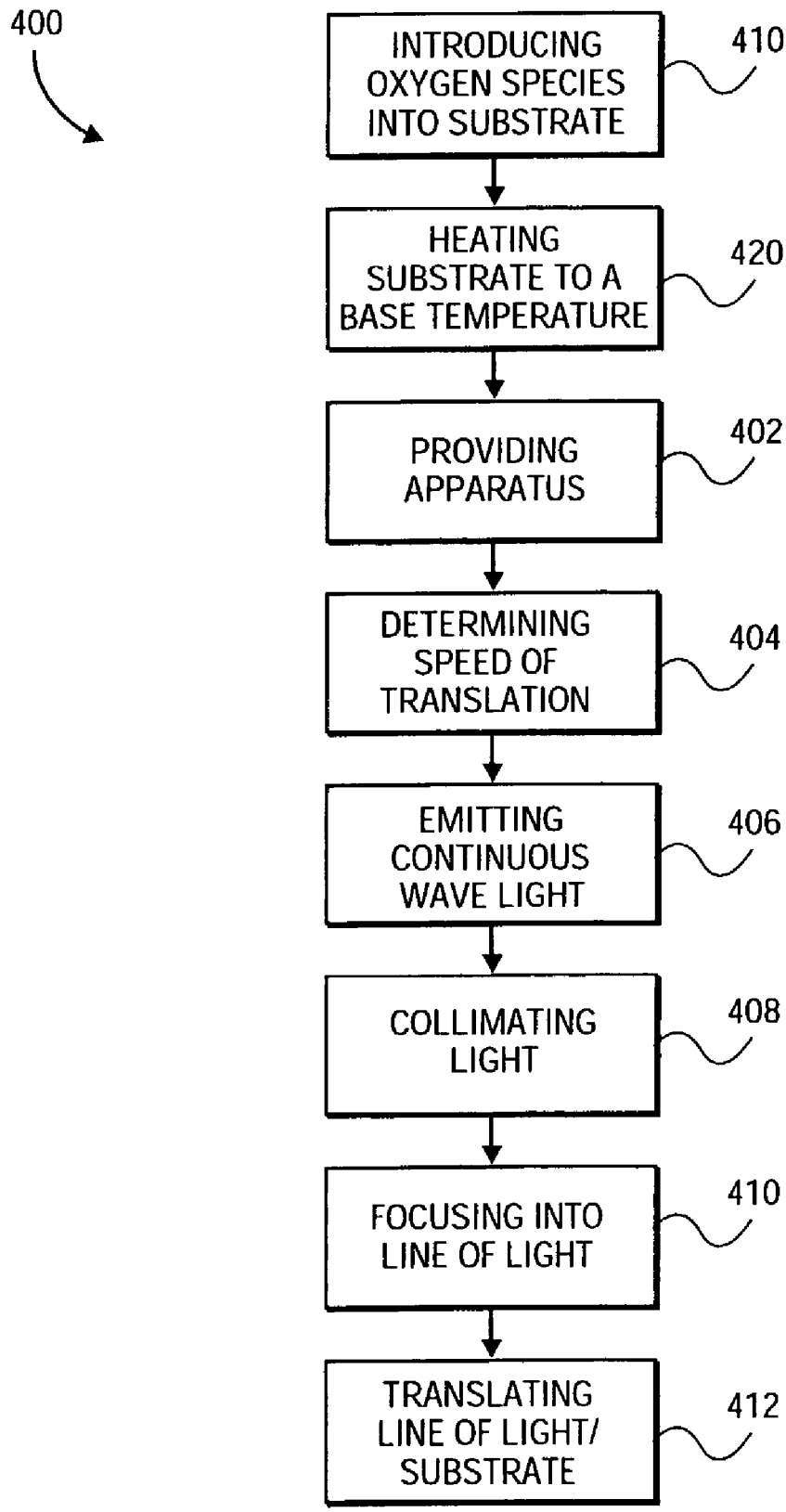
FIG. 7 is a flow chart of a method for thermally processing a substrate.

FIG. 7 is a flow chart of a method for thermally processing a semiconductor substrate 214 as part of an SOI process. Referring to FIG. 7 and flow chart 400, an oxygen species such as $O_2$ is introduced (e.g., implanted) into a semiconductor substrate (block 410). The oxygen species introduction may be done in the same or a different environment (e.g., chamber) than an apparatus used for a subsequent anneal. Following introduction of oxygen species into substrate 214, substrate 214 may optionally be heated to a base temperature sufficient to inhibit thermal stress to the substrate during a subsequent anneal using the electromagnetic radiation source (block 420). A representative base temperature is on the order of 600 to 700° C. for a silicon wafer. An apparatus as described above in relation to FIGS. 4 and 6 is provided at block 402. Reference to components identified in FIG. 4 will be made henceforth. Controller 226 then determines, at block 404, the scan speed at which line of radiation 222 and substrate 214 will move relative to one another. This determination is based on, for example, the thermal recipe for processing the substrate; the substrate properties; the power of electromagnetic radiation source 202; the width of the line of radiation; the power density at the line of radiation, etc. In an SOI process on a silicon wafer, for example, in one embodiment, a suitable thermal recipe calls for heating substrate 214 to a temperature approaching but generally not exceeding the melting point of silicon (e.g., about 1410° C. or greater) to form an insulation layer (e.g., insulator layer 120 in FIG. 3).

Electromagnetic radiation source 202 emits continuous wave of radiation 204, at block 406. This radiation 204 is, in one embodiment, collimated into collimated beam of radiation 208, at step 408. The collimated beam of radiation 208 is focused into line of radiation 222, at block 410. In accordance with the predetermined scan velocity or speed, stage 216 and line of radiation 222 are translated, at block 412, relative to one another by translation mechanism 218 (FIG. 5). This translation is along a path perpendicular to line of radiation 222 and parallel to the upper surface of the substrate, such that line of radiation 222 traverses the entire surface of semiconductor substrate 214. In one embodiment, the translation mechanism 218 scans the radiation source and optics over the upper surface of the substrate at approximately 2 cm/s.

Figure 8:
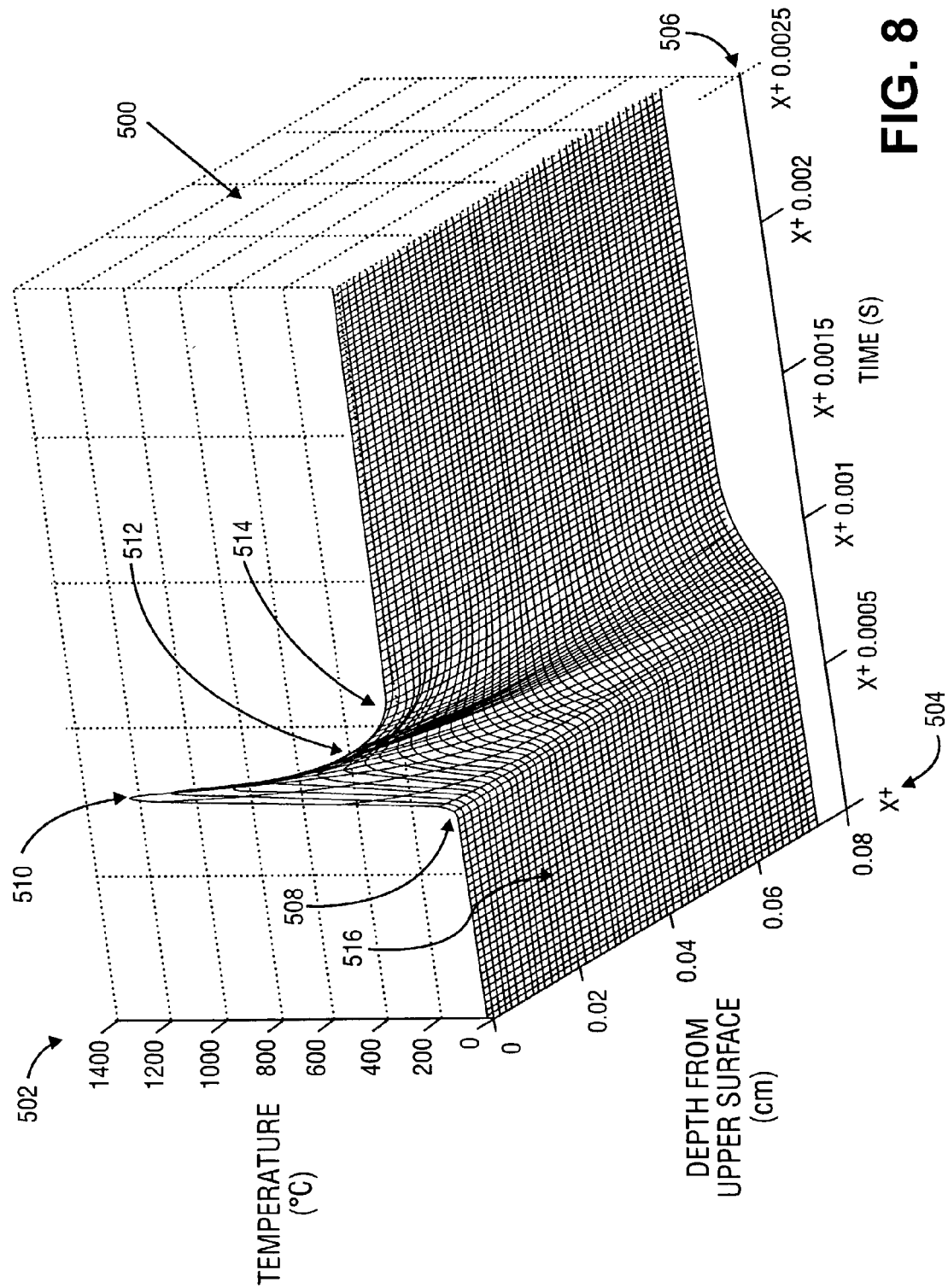
FIG. 8 is a graph of the temperature at a fixed point on and through a substrate during thermal processing.

FIG. 8 is a graph 500 of the temperature versus time and depth at a fixed point on and through the substrate during thermal processing performed according to the method described above in relation to FIG. 7. Temperature axis 502 indicates a temperature of between 0 and 1400° C. at the fixed point. Axis 504 indicates a depth from upper surface 224 into substrate 214 (FIG. 4) at the fixed point. Axis 506 indicates the time in seconds at some point after the start of scanning. The fixed point is assumed to be located at 508.

Referring to FIG. 4 and FIG. 8, as line of radiation 222 scans across upper surface 224 of substrate 214 it subjects a line or chord on the substrate to the heat it generates. Before line of radiation 222 reaches fixed point 508, the temperature at fixed point 508, both at the upper surface and throughout a substrate cross-section at the fixed point, in this example, is ambient temperature or some predetermined baseline temperature (e.g., 600° C. to 700° C.), as indicated by reference numeral 516. As line of radiation 222 reaches the fixed point at 508, the temperature at the upper surface of substrate 214 ramps up, in this example, to 1200° C. almost instantaneously, as shown by reference numeral 510. At the same time, the substrate acts as a heat sink resulting in a dramatic drop-off in temperature away from the surface, as indicated by reference numeral 512. For example, at 0.04 cm from the point on the upper surface the temperature is approximately 200° C. Thus, the heating effect is generally localized to the upper surface only. This is extremely advantageous, as generally only the regions near the surface 224 (FIG. 4) of substrate 214 require thermal processing. In terms of an SOI process, 1000 Å to 3000 Å ($10^{-9}$ cm) is close enough to the surface that this depth receives approximately the peak heat generation from line of radiation 222. Radiation intensity and residence time of line of radiation 222 on fixed point 208 generally determines the heat generation at that point.

As the line of radiation passes over and away from the fixed point, the temperature drops rapidly, as shown at reference numeral 514. Again this is generally because substrate 214 acts representatively as a heat sink diffusing the heat at the upper surface throughout the remainder of the cooler substrate. This transfer of heat to the bulk of the substrate assists homogenous thermal exposure, as heat has enough time to diffuse from a locally strong absorbing device region to a lower absorbing device region. Also, pattern density effects are comparable to RTP. However, the time scale is short enough to limit the diffusion depth of the heat transfer to several microns, as opposed to the several hundred-micron thickness of a substrate, as is the case with RTP, thereby greatly reducing the total required power. The bulk of the substrate is not appreciably heated, thereby providing an ideal heat sink for the temperature ramp down.

In the preceding detailed description, the invention is described with reference to specific embodiments thereof. In one example, an SOI process is described, for example, in terms of introducing a species (oxygen) into a substrate and translating linearly focused electromagnetic radiation across the substrate sufficient to thermally influence the oxygen species and form an insulating layer in the substrate. It will, however, be evident that various modifications and changes may be made thereto without departing from the broader spirit and scope of the invention as set forth in the claims. For example, species other than oxygen may be introduced into a substrate and thermally influenced. The specification and drawings are, accordingly, to be regarded in an illustrative rather than a restrictive sense.

What is claimed is:

1. A method comprising:
introducing a species into a substrate comprising semiconductor material; and
translating linearly focused electromagnetic radiation continuously across a device side surface of the substrate in a first direction for a period of time sufficient to thermally influence the species to react with the semiconductor material within the substrate,
wherein the electromagnetic radiation is focused from only one single continuously emitting electromagnetic radiation source to continuously extend linearly across a total diameter of the substrate in a form of a single continuously emitted line in a second direction different than the first direction during translating, wherein during translating, the continuously emitted line comprises a laser that extends across the entire width of a wafer so that the wafer can be annealed by a single scan of the laser over the wafer surface.

2. The method of claim 1, wherein the species comprises oxygen, and wherein the semiconductor material comprises silicon and the electromagnetic radiation is sufficient to raise a portion of the substrate close to the melting point of silicon.

3. The method of claim 2, wherein the portion of substrate comprises less than 3000 Angstroms from the surface of the substrate, and wherein the linearly focused electromagnetic radiation has a line width of less than 500 microns.

4. The method of claim 1, wherein prior to translating electromagnetic radiation, the method comprises heating the substrate to a temperature sufficient to inhibit stress attributable to the translating of electromagnetic radiation.

5. The method of claim 1, wherein translating comprising translating the continuous line of electromagnetic radiation across a surface of the substrate in a first direction wherein the line extends in a second direction perpendicular to the first direction.

6. The method of claim 1 wherein translating further comprises ramping up the temperature across the device side surface of the substrate.

7. The method of claim 1 wherein translating further comprises providing approximate peak heat generation to a depth of between 1000 Angstroms and 3000 Angstroms during a silicon on insulator processing of the device side surface and wherein translating further comprises limiting the thermal influence to a heat transfer diffusion depth of several microns.

8. The method of claim 1 further comprising, after translating, using the substrate to heat sink diffuse the device side surface to thermally homogenously expose the surface by diffusing the thermal influence form a locally strong absorbing device region to a lower absorbing device region.

9. The method of claim 1 wherein the continuously emitted line during translating includes a line of radiation having a length that extends at least across the entire diameter or width of the substrate.

10. The method of claim 1 wherein during translating, the continuously emitted line traverses the entire surface of the substrate at a single scan speed.

11. The method of claim 1, wherein during translating of one single scan of the surface, the continuously emitted line has a single power intensity in the second direction and across the total diameter as it traverses the entire surface of the substrate in the first direction.

12. The method of claim 11, wherein the substrate is a wafer and during translating, the continuously emitted line has a single power intensity in the second direction and across a total diameter of the wafer as it traverses the entire surface of the wafer in the first direction.

13. The method of claim 1, further comprising emitting laser light across the entire width of the wafer in the second direction; and
    annealing the entire surface of the wafer during a single pass of the laser light over the entire surface in the first direction.

14. A method comprising:
    introducing an oxygen species into a semiconductor substrate; and
    forming an oxide film in the substrate by translating in a first direction, only one single continuous electromagnetic radiation continuously emitted across a device side surface of the substrate in the form of a single focused line that continuously extends linearly across a total diameter of the substrate in a continuous line in a second direction different than the first direction during translating, wherein during translating, the continuously emitted line comprises a laser that extends across the entire width of a wafer so that the wafer can be annealed by a single scan of the laser over the wafer surface.

15. The method of claim 14, wherein the substrate comprises silicon and the electromagnetic radiation is sufficient to raise a portion of the substrate close to the melting point of silicon.

16. The method of claim 15, wherein the portion of substrate comprises less than 1000 nanometers from the surface of the substrate and wherein the linearly focused electromagnetic radiation has a line width of less than 500 microns.

17. The method of claim 14, wherein prior to translating electromagnetic radiation, the method comprises heating the substrate to a temperature sufficient to inhibit stress attributable to the translating of electromagnetic radiation.

18. The method of claim 14, wherein translating continuous electromagnetic radiation across the surface of the substrate comprises translating a continuous line of radiation in a first direction across a surface of the substrate wherein the line extends in a second direction perpendicular to the first direction.

19. The method of claim 14, wherein during translating, the continuously emitted line has a single power intensity in the second direction and across the total diameter as it traverses the entire surface of the substrate in the first direction during one single scan of the surface at a single scan speed.

20. The method of claim 19, wherein the substrate is a wafer and during translating, the continuously emitted line has a single power intensity in the second direction and across a total diameter of the wafer as it traverses the entire surface of the wafer in the first direction at a single scan speed.

21. The method of claim 14, further comprising emitting laser light across the entire width of the wafer in the second direction; and
    annealing the entire surface of the wafer during a single pass of the laser light over the entire surface in the first direction.

22. A method comprising:
    introducing a species into a substrate comprising semiconductor material;
    translating linearly focused electromagnetic radiation continuously across a device side surface of the substrate for a period of time sufficient to thermally influence the species to react with the semiconductor material within the substrate,
    wherein the electromagnetic radiation is focused from a continuously emitting electromagnetic radiation source to continuously extend linearly across a diameter of the substrate in a form of a continuously emitted line during translating, wherein during translating, the continuously emitted line traverses the entire surface of the substrate at a single power intensity; and
    forming a layer of insulator material only at a depth between 1000 angstroms and 3000 angstroms below the device side surface, as a result of introducing and translating.

23. A method comprising:
    introducing an oxygen species into a semiconductor substrate;
    forming an oxide film in the substrate by translating continuous electromagnetic radiation continuously emitted across a device side surface of the substrate in the form of a focused line that continuously extends linearly across a diameter of the substrate in a continuous line during translating, wherein during translating, the continuously emitted line traverses the entire surface of the substrate at a single power intensity; and
    forming a layer of insulator material only at a depth between 1000 angstroms and 3000 angstroms below the device side surface, as a result of introducing and translating.

* * * * *

UNITED STATES PATENT AND TRADEMARK OFFICE
CERTIFICATE OF CORRECTION

PATENT NO. : 8,288,239 B2  
APPLICATION NO. : 10/261379  
DATED : October 16, 2012  
INVENTOR(S) : Dean C. Jennings et al.

It is certified that error appears in the above-identified patent and that said Letters Patent is hereby corrected as shown below:

In the Claims:

Column 8, Claim 8, line 62, please delete "influence form" and insert --influence from--.

Column 10, Claim 22, line 33, and Claim 23, line 48, please capitalize the word --Angstroms-- in its four occurrences.

Signed and Sealed this
Fourth Day of June, 2013

Teresa Stanek Rea
*Acting Director of the United States Patent and Trademark Office*